(12) United States Patent
Nakamura (10) Patent No.: US 11,069,650 B2
(45) Date of Patent: Jul. 20, 2021

(54) BONDING CONDITION EVALUATION APPARATUS

(71) Applicant: SHINKAWA LTD., Tokyo (JP)

(72) Inventor: Tomonori Nakamura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/809,553

(22) Filed: Mar. 5, 2020

(65) Prior Publication Data

US 2020/0286852 A1 Sep. 10, 2020

(30) Foreign Application Priority Data

Mar. 5, 2019 (JP) .............................. JP2019-039977

(51) Int. Cl.
*H01L 21/67* (2006.01)
*H01L 23/00* (2006.01)

(52) U.S. Cl.
CPC ........ *H01L 24/81* (2013.01); *H01L 21/67144* (2013.01); *H01L 24/11* (2013.01); *H01L 24/13* (2013.01); *H01L 24/75* (2013.01); *H01L 2224/81203* (2013.01); *H01L 2224/83203* (2013.01)

(58) Field of Classification Search
CPC ......... H01L 24/81; H01L 24/11; H01L 24/13; H01L 2224/81203; H01L 24/75; H01L 21/67092; H01L 21/67144; H01L 2224/83203
See application file for complete search history.

(56) References Cited

U.S. PATENT DOCUMENTS

| 2009/0045507 A1* | 2/2009 | Pendse .................. H01L 21/563 257/734 |
| 2009/0145546 A1* | 6/2009 | Inamoto ............... H05K 3/3489 156/272.6 |
| 2013/0270230 A1* | 10/2013 | Cheung .................. H01L 24/75 219/121.6 |
| 2014/0170813 A1* | 6/2014 | Hu .......................... H01L 24/83 438/109 |
| 2019/0252349 A1* | 8/2019 | Bajwa ..................... H01L 24/75 |
| 2020/0286854 A1* | 9/2020 | Nakamura ............... H01L 24/83 |
| 2020/0388507 A1* | 12/2020 | Seyama .................. H01L 24/32 |

* cited by examiner

*Primary Examiner* — Douglas W Owens
(74) *Attorney, Agent, or Firm* — JCIPRNET (57) ABSTRACT

The apparatus which assists in deriving bonding conditions includes a bonding unit which bonds a semiconductor chip and a substrate by applying heat and pressure with NCF interposed therebetween, a library in which a variety of physical property information including viscosity characteristic information is collected with respect to each of a plurality of types of NCFs, an initial evaluation condition determination unit which acquires the physical property information corresponding to the NCF used for bonding with reference to the library and determines an initial value of an evaluation condition of bonding evaluation performed by bonding the semiconductor chip and the substrate, and a bonding evaluation unit which drives the bonding unit in accordance with set evaluation condition, bonds the semiconductor chip and the substrate and performs the bonding evaluation at least once to measure the viscosity of the NCF at the time of the bonding.

7 Claims, 4 Drawing Sheets

BONDING CONDITION EVALUATION APPARATUS

CROSS-REFERENCE TO RELATED APPLICATION

This application claims the priority benefit of Japan Patent Application No. 2019-039977, filed on Mar. 5, 2019. The entirety of each of the above-mentioned patent application is hereby incorporated by reference herein and made a part of the specification.

BACKGROUND

Technical Field

The specification discloses an apparatus which assists in deriving bonding conditions when a first member and a second member are bonded by applying heat and pressure with a bonding member interposed therebetween.

Description of Related Art

Conventionally, a bonding method in which two members (a first member and a second member) are bonded by applying heat and pressure in a state in which a thermosetting bonding member is interposed between the two members is known. For example, in a mounting apparatus for manufacturing a semiconductor device by mounting a semiconductor chip (a first member) on a substrate (a second member), a bonding member such as an NCF made of a thermosetting resin is sandwiched between a semiconductor chip and a substrate, and in this state, the semiconductor chip is pressed toward the substrate and heated. In this case, the bonding member needs to be softened to fill a gap between the semiconductor chip and the substrate before metal bumps provided on the semiconductor chip are thermally melted, and then to be thermally cured. Therefore, in order to properly mount the semiconductor chip, the semiconductor chip is heated under heating conditions in which the bonding member reaches a curing temperature before the metal bumps reach a melting start temperature.

Bonding conditions including such heating conditions need to be changed even when the same bonding member is used if the combination of the first member and the second member is changed. That is, even when the bonding members are the same, if structures (materials or shapes) of the first member and the second member to which the bonding member is applied change, heat transfer characteristics and the like to the bonding member also change greatly, and physical properties (particularly, the curing temperature and the like) of the bonding member change.

Therefore, whenever the combination of the first member, the second member, and the bonding member changes, suitable bonding conditions are determined. Generally, such heating conditions are often determined by trial and error in which bonding is actually repeated while the bonding conditions are changed. However, simply repeating trial and error blindly increases the number of trials. Therefore, it is conceivable to narrow the bonding conditions to some extent with reference to generally provided physical property information. For example, viscosity-temperature characteristics of a bonding member are provided by a material manufacturer who manufactures a material used for the bonding member.

However, such viscosity-temperature characteristics provided by a material manufacturer are usually viscosity characteristics in a quasi-static state measured by elevating a temperature at a heating rate of 10° C./min (0.167° C./sec). On the other hand, at the time of actual bonding, each of the members including the bonding member is often heated more rapidly than the above-described heating rate for the purpose of shortening a bonding time. That is, when the semiconductor chip is bonded to the substrate, the semiconductor chip is heated at a heating rate of 3° C./sec or more. In this case, the bonding member is in a transient state in which it exhibits characteristics different from those in a steady state even though the temperature is the same. Since the viscosity characteristics of the bonding member in the transient state are significantly different from those in the steady state provided by the material manufacturer, it has been difficult to narrow down the bonding conditions efficiently even with reference to the characteristic information in such a steady state.

SUMMARY

An apparatus disclosed in an embodiment of the specification is an apparatus that assists in deriving bonding conditions when bonding is performed by applying heat and pressure to a first member and a second member with a bonding member interposed therebetween, including a bonding unit that bonds the first member and the second member by applying heat and pressure with the bonding member interposed therebetween, a library in which a variety of physical property information including viscosity characteristic information indicating a correlation between a viscosity of the bonding member and a heating condition in a heated transient state is collected for each of a plurality of types of bonding members, an initial evaluation condition determination unit that acquires the physical property information corresponding to the bonding member used for bonding with reference to the library and determines an initial value of an evaluation condition of bonding evaluation performed by bonding the first member and the second member, and a bonding evaluation unit that drives the bonding unit in accordance with set evaluation condition, bonds the first and second members and performs the bonding evaluation at least once to measure the viscosity of the bonding member at the time of the bonding.

DESCRIPTION OF THE EMBODIMENTS

Thus, the embodiments of the specification disclose an apparatus that is able to assist in deriving bonding conditions more efficiently.

In this case, the viscosity characteristic information may be information that indicates a correlation between the viscosity and the heating condition when the bonding member is heated at a heating rate of 3° C./sec or more.

Further, the viscosity characteristic information may include at least a change characteristic of the viscosity with respect to a temperature in accordance with a difference in a heating rate. In this case, the viscosity characteristic information may further include a change characteristic of the viscosity with respect to a temperature in accordance with a difference in a heating start temperature.

Further, the bonding evaluation unit may determine whether the evaluation condition needs to be corrected on the basis of the viscosity measured in the bonding evaluation, may repeat correction of the evaluation condition and re-execution of the bonding evaluation until it is determined that the correction is unnecessary and may identify the corrected evaluation condition at the time when it is determined that the correction is unnecessary as the bonding condition.

In this case, the first member may be a semiconductor chip having metal bumps formed on a bottom surface, and the bonding evaluation unit may determine whether or not it is necessary to correct the evaluation condition on the basis of the viscosity of the bonding member at a timing when the metal bumps are melted.

Further, the bonding evaluation unit may identify a melting timing of the metal bumps on the basis of a change in a thickness of the bonding member and may calculate the viscosity of the bonding member at the melting timing on the basis of the change in the thickness immediately after the melting timing.

According to the apparatus disclosed in the embodiments of the specification, since an initial value of an evaluation condition is determined on the basis of physical property information including viscosity property information indicating a correlation between a viscosity of a bonding member and heating conditions in the transient state, in other words, in a state close to actual bonding, the bonding conditions can be narrowed down efficiently. Furthermore, since actual bonding and measurement (bonding evaluation) are performed on the basis of the narrowed bonding conditions (evaluation conditions), the bonding conditions can be derived more efficiently.

Figure 1:
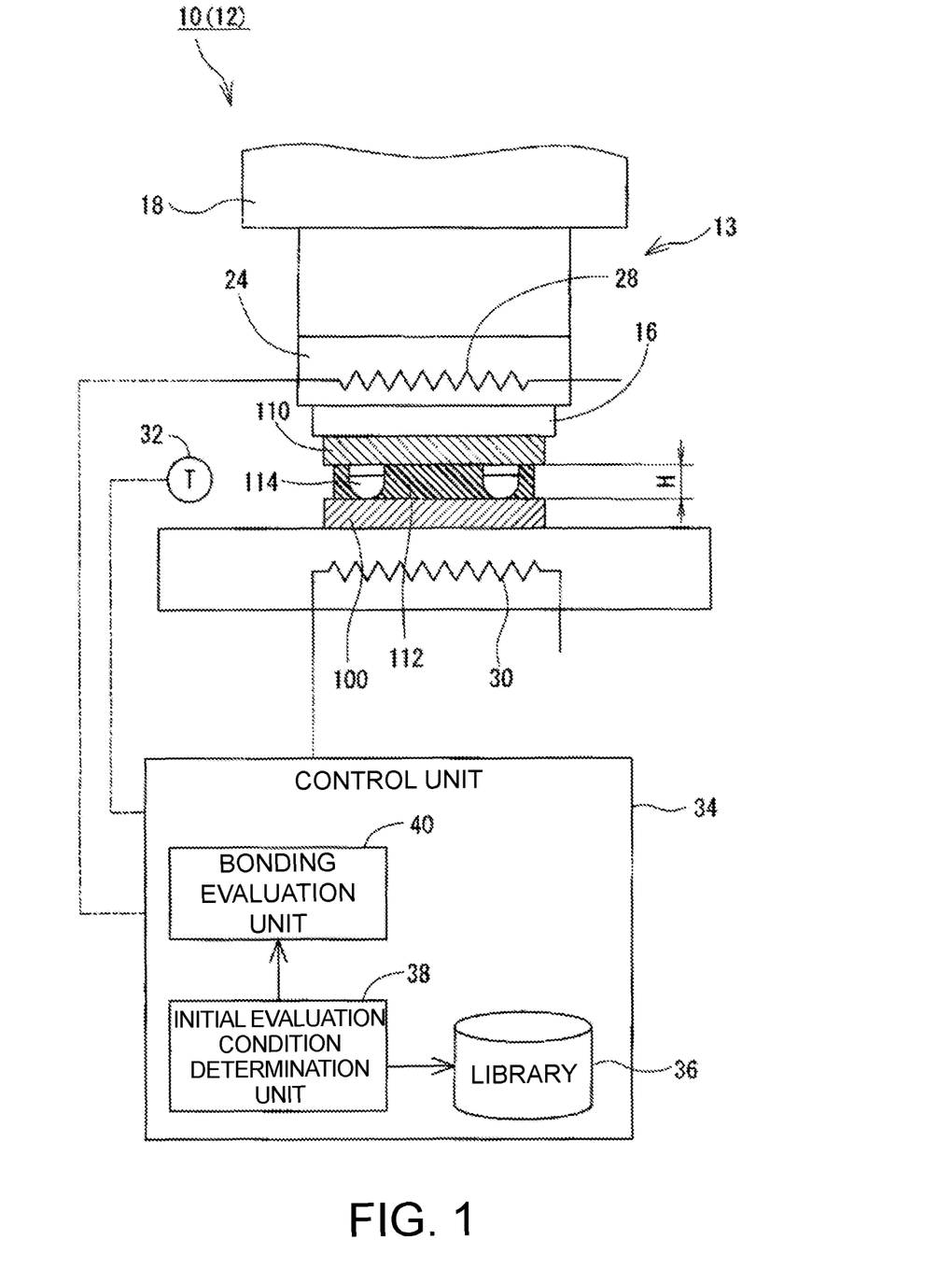
FIG. 1 is a diagram showing a configuration of bonding condition derivation support device.

Hereinafter, a bonding condition derivation support device 10 will be described with reference to the drawings. FIG. 1 is a schematic diagram showing a configuration of the bonding condition derivation support device 10. The bonding condition derivation support device 10 is a device which assists in deriving bonding conditions, particularly, heating conditions when bonding is performed by applying heat and pressure in a state in which a bonding member is interposed between a first member and a second member. Although the first member, the second member, and the bonding member are not particularly limited, a case in which a semiconductor chip 110 is bonded to a substrate 100 via a non-conductive film (hereinafter referred to as NCF) 112 will be exemplified below. Before a specific configuration of the bonding condition derivation support device 10 is described, the bonding between the semiconductor chip 110 and the substrate 100 will be briefly described.

A plurality of metal bumps 114 are formed to protrude on a bottom surface of the semiconductor chip 110. Further, the NCF 112 made of a thermosetting resin or the like is attached to the metal bumps 114. When the semiconductor chip 110 is bonded to the substrate 100, the semiconductor chip 110 is pressed and heated toward the substrate 100 with the metal bumps 114 facing the substrate 100. The semiconductor chip 110 is electrically connected to the substrate 100 by heating and melting the metal bumps 114 and forming an alloy between the semiconductor chip 110 and electrodes of the substrate 100. Further, prior to the melting of the metal bumps 114, the NCF 112 is temporarily softened and then cured. That is, in an initial stage of temperature rise, the NCF 112 is softened, and enters and fills a gap between the semiconductor chip 110 and the substrate 100. Thereafter, when the temperature further increases, the NCF 112 is thermally cured, and the semiconductor chip 110 is mechanically fixed to the substrate 100.

Figure 2:
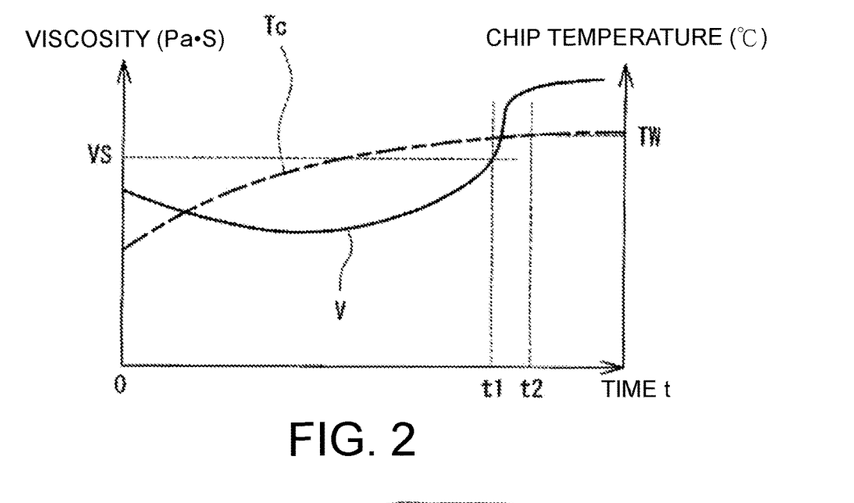
FIG. 2 is a graph showing a change over time in a temperature of a semiconductor chip and a viscosity of an NCF at the time of bonding.

FIG. 2 is a graph showing a temporal change of a temperature Tc of the semiconductor chip 110 (and, by extension, the metal bumps 114) and a viscosity V of the NCF 112 when the semiconductor chip 110 is bonded to the substrate 100 under ideal bonding conditions. In FIG. 2, a solid line indicates the viscosity V of the NCF 112, and an alternate long and short dash line indicates the temperature Tc of the semiconductor chip 110. Also, in FIG. 2, a horizontal axis indicates time, and a vertical axis indicates the viscosity and temperature. As shown in FIG. 2, when heat and pressure are applied to bond the semiconductor chip 110 to the substrate 100, the temperature of the metal bumps 114 gradually increases. Then, when the metal bumps 114 reach a melting start temperature TW at time t2, the metal bumps 114 are melted and form an alloy between the semiconductor chip 110 and the electrodes of the substrate 100. Further, similarly to the metal bumps 114, the temperature of the NCF 112 gradually increases. In an initial stage of the temperature rise, the viscosity V of the NCF 112 gradually decreases. During a period in which the viscosity V decreases, the NCF 112 enters a gap between the semiconductor chip 110 and the substrate 100. Thereafter, as the temperature further increases, the viscosity V of the NCF 112 reverses to an increasing tendency. Then, at time t1, the viscosity V of the NCF 112 reaches a curing viscosity VS and is cured, and thus the semiconductor chip 110 is mechanically fixed to the substrate 100.

Here, in order to properly bond the semiconductor chip 110 to the substrate 100, the NCF 112 has to reach the curing viscosity VS before the time t2 at which the metal bumps 114 begin to melt (that is, t1<t2). Further, in order to reduce a bonding time and a task time for manufacturing a semiconductor device, both the time t2 until the metal bumps 114 melt and the time t1 until the NCF 112 is cured are desirably short. Furthermore, for efficient bonding, a time t2−t1 from the time when the NCF 112 is cured to the time when the metal bumps 114 are melted is desirably as short as possible. The bonding condition derivation support device 10 of the embodiment supports derivation of the bonding conditions (particularly, the heating conditions) which satisfy such a demand.

Next, a configuration of the bonding condition derivation support device 10 will be described with reference to FIG. 1. The bonding condition derivation support device 10 of the example is incorporated in a mounting device 12 which bonds and mounts the semiconductor chip 110 on the substrate 100. Therefore, a part of the configuration of the bonding condition derivation support device 10 uses a configuration provided in the mounting device 12.

The bonding condition derivation support device 10 (the mounting device 12) is roughly divided into a bonding unit 13 which actually performs a bonding operation, and a control unit 34 which controls driving of the bonding unit 13. The bonding unit 13 includes a stage 14 on which the substrate 100 is placed, and a bonding head 18 which can move relative to the stage 14. The stage 14 vacuum-suctions the placed substrate 100. A stage-side heater 30 which heats the substrate 100 is incorporated in the stage 14. The temperature rise of the stage-side heater 30 is controlled by the control unit 34.

The bonding head 18 serves to hold the semiconductor chip 110 and then to place the semiconductor chip 110 on the substrate 100 to apply heat and pressure thereto, and a bonding tool 16 which suctions and holds the semiconductor chip 110 is provided at a tip end of the bonding head 18. A heat block 24 in which a tool-side heater 28 is incorporated is provided above the bonding tool 16. The tool-side heater 28 is a heater which heats the semiconductor chip 110 via the bonding tool 16. Since it is desired that the semiconductor chip 110 be rapidly heated (for example, 300° C./sec) as will be described later, the tool-side heater 28 is desirably a heater which can rapidly increase the temperature, for example, a pulse heater or the like. The temperature rise of the tool-side heater 28 is also controlled by the control unit 34.

The semiconductor chip 110 is bonded to the substrate 100 by moving down and pressing the bonding tool 16 toward the substrate 100 and heating the semiconductor chip 110 with the tool-side heater 28 in a state in which the semiconductor chip 110 is suctioned and held by the bonding tool 16. Sensors (not shown) which detect a pressing load F and a height of the bonding head 18 at this time are provided in the bonding head 18, and results detected by the sensors are transmitted to the control unit 34. The control unit 34 controls driving of the bonding tool 16 on the basis of the detected results and calculates a thickness H and a viscosity V of the NCF 112.

A temperature sensor 32 which detects a temperature of the NCF 112 is further provided in the bonding unit 13. The temperature sensor 32 is, for example, a non-contact type temperature sensor. The temperature detected by the temperature sensor 32 is transmitted to the control unit 34.

The control unit 34 controls the driving of the bonding unit 13 and evaluates and determines the bonding conditions. The control unit 34 is, for example, a computer having a CPU which performs various calculations and a memory which stores various data and programs. Further, the control unit 34 can be roughly divided into a library 36, an initial evaluation condition determination unit 38, and a bonding evaluation unit 40 in terms of functions. Before the units are described, evaluation and determination of the bonding conditions performed by the bonding condition derivation support device 10 will be briefly described.

When the semiconductor chip 110 is bonded to the substrate 100, the bonding unit 13 is operated under predetermined bonding conditions. Here, the bonding conditions include, for example, a pressing load F, a heating rate R, a heating start temperature Ts, and the like when the semiconductor chip 110 is heated and pressed. The bonding conditions have to be appropriately changed according to a combination of the semiconductor chip 110, the substrate 100, and the NCF 112 used for bonding. For example, even when the substrate 100 and the NCF 112 are the same as those used in the past, if a structure of the semiconductor chip 110 (for example, the size or the number of metal bumps 114) is different from one used in the past, behavior of the NCF 112 changes with heating. Therefore, when the bonding is performed under the same bonding conditions as those used in the past despite the structure of the semiconductor chip 110 being different, there is a possibility that the bonding may not be performed appropriately.

Therefore, whenever the combination of the members to be bonded is changed, an operator would have to find the new bonding conditions. Conventionally, setting of such bonding conditions was often performed by trial and error in which the bonding operation was repeated while the bonding conditions were changed. However, when the trial and error were blindly repeated, the number of trials would be enormous, and a burden of determining the bonding conditions would be great. The bonding condition derivation support device 10 of the embodiment is a device which provides assistance so that such bonding conditions, in particular, the heating conditions including the heating rate R and the heating start temperature Ts, can be easily derived.

A configuration of the control unit 34 will be described again with reference to FIG. 1. The library 36 in which physical property information of each of the plurality of types of NCFs 112 is stored in advance is provided in the control unit 34. That is, there are various types of NCFs 112 which are bonding members having different materials and different thicknesses. The library 36 stores the physical property information of each of the plurality of types of NCFs 112. The physical property information includes viscosity information which indicates a correlation between the temperature and the viscosity V in a transient state when the bonding member is rapidly heated, and specific contents thereof will be described later in detail.

The initial evaluation condition determination unit 38 acquires the physical property information corresponding to the NCF 112 used for actual bonding with reference to the library 36 and determines initial values of the bonding conditions (evaluation conditions) used in bonding evaluation that will be described later on the basis of the physical property information. The number of executions of the bonding evaluation that will be described later can be significantly reduced by determining the initial values of the evaluation conditions with reference to the library 36.

The bonding evaluation unit 40 determines the bonding conditions by repeatedly performing the bonding evaluation according to the evaluation conditions and correcting the evaluation conditions on the basis of evaluation results. Here, in the bonding evaluation, the bonding is actually performed with the combination of the semiconductor chip 110, the substrate 100, and the NCF 112 to be bonded, and the viscosity of the NCF 112 at the time of the bonding is measured. The bonding evaluation unit 40 determines whether or not the evaluation conditions need to be corrected on the basis of a measured viscosity (an evaluation result). When it is determined that the correction is unnecessary, the evaluation conditions at that time are determined as the bonding conditions. On the other hand, when it is determined that the evaluation conditions need to be corrected, the evaluation conditions are corrected, and then the bonding and the measurement of the viscosity are performed again.

The viscosity V of the NCF 112 can be obtained from a change in the thickness H of the NCF 112 at the time of the bonding. That is, when a pressing load F is applied to the NCF 112 via the semiconductor chip 110, the thickness H of the NCF 112 gradually decreases. A rate of decrease in the thickness H changes according to the viscosity V of the NCF 112. Therefore, in the example, the viscosity V of the NCF 112 is obtained from the temporal change of the thickness H of the NCF 112. Specifically, when the pressing load is defined as F(N), the time as t (sec), the thickness of the NCF 112 as H(m), and a volume of the NCF 112 as Q(m3), the viscosity V (Pa·S) of the NCF 112 is calculated by the following Equation (1).

$$V=2*\pi*F*H^5/3*Q*(-dH/dt)(2*\pi*H^3+Q) \quad \text{Equation (1)}$$

Figure 3:
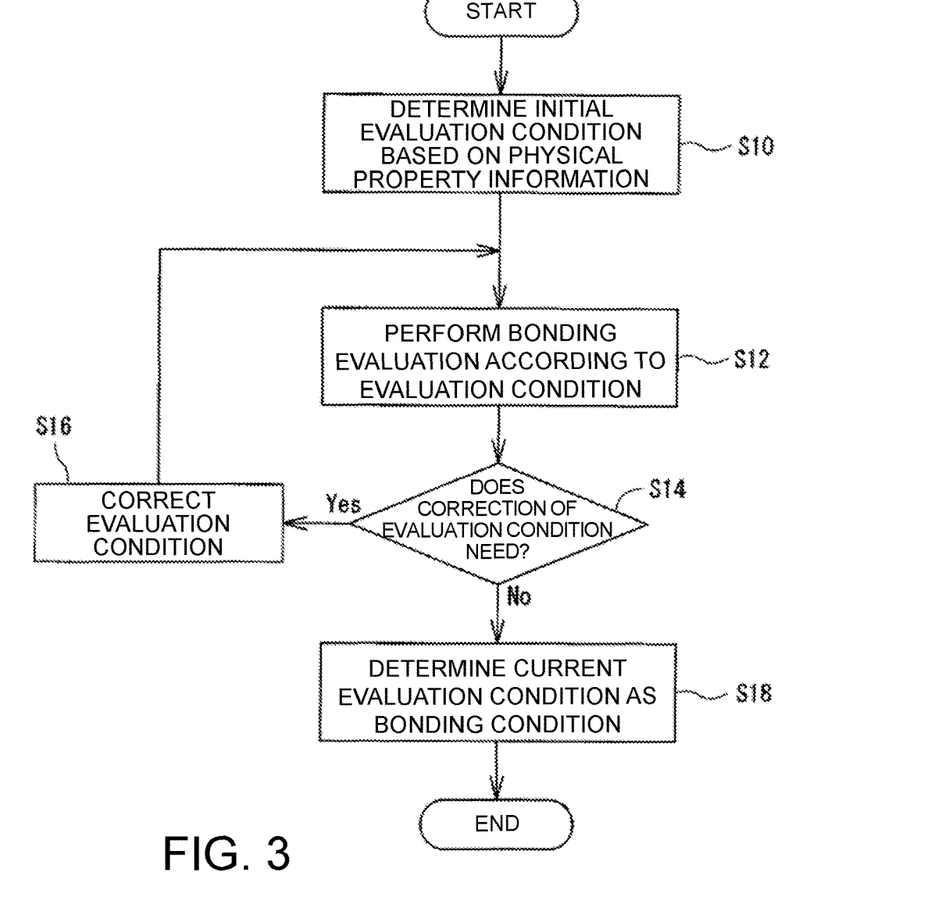
FIG. 3 is a flowchart showing a flow of determining bonding conditions.

FIG. 3 is a flowchart showing a flow of determining such bonding conditions. As shown in FIG. 3 and as described above, when the bonding conditions are determined, the initial evaluation condition determination unit 38 determines the initial evaluation conditions with reference to the library 36 (S10). Subsequently, the bonding evaluation unit 40 performs the bonding evaluation according to the set evaluation conditions, that is, performs the bonding and the measurement of the viscosity V of the NCF 112 at the time of the bonding (S12). Subsequently, the bonding evaluation unit 40 determines whether or not it is necessary to correct the evaluation conditions on the basis of the measured viscosity V (S14). When it is determined that the evaluation conditions do not need to be corrected, the bonding evaluation unit 40 determines the evaluation conditions at that time as the bonding conditions (S18). On the other hand, when it is determined that the evaluation conditions need to be corrected, the bonding evaluation unit 40 corrects the evaluation conditions (S16) and performs the bonding evaluation again (S12). Then, this process is repeated until it is determined that the correction of the evaluation conditions is unnecessary.

Next, the physical property information stored in the library 36 will be described in detail. As described above, the library 36 stores the physical property information of each of the plurality of types of NCFs 112. Further, the physical property information includes at least viscosity property information which indicates a relationship between the heating conditions of the NCF 112 and a curing temperature Th. This viscosity property information will be described with reference to FIGS. 4 to 6.

Figure 4:
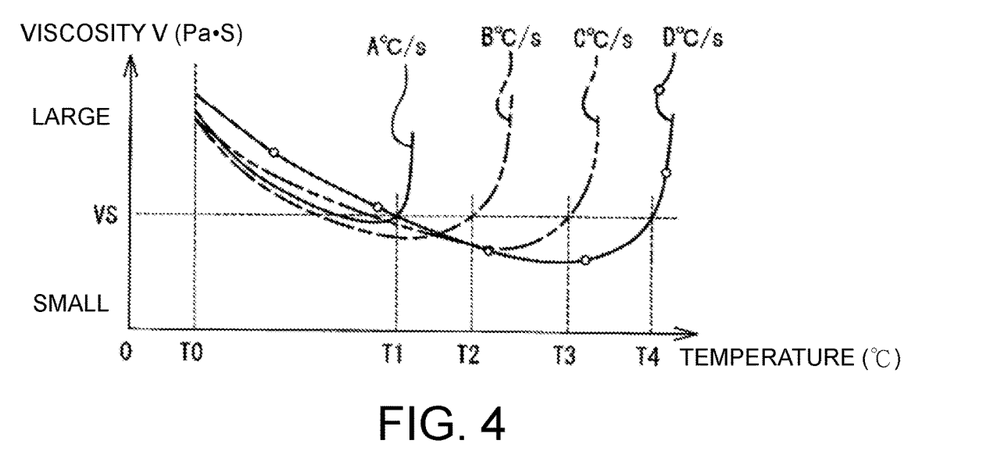
FIG. 4 is a diagram showing a difference in temperature-viscosity characteristics of an NCF due to a difference in a heating rate.

FIG. 4 is a diagram showing a difference in temperature-viscosity characteristics due to a difference in temperature increase rate when the NCF 112 is heated, that is, a difference in the heating rate R. In FIG. 4, a horizontal axis indicates the temperature of the NCF 112, and a vertical axis indicates the viscosity V of the NCF 112. Among them, VS indicates a viscosity when the NCF 112 is sufficiently cured, that is, a cured viscosity VS. Further, in FIG. 4, four curves are temperature-viscosity characteristic curves when the NCF 112 is heated at four heating rates R=A, B, C, and D (A<B<C<D). The heating rate R is a heating rate which is assumed to be employed in an actual bonding operation and is 3° C./sec or more, exemplarily 20° C./sec or more. As is clear from FIG. 4, the temperature-viscosity characteristic curves of the NCF 112 are greatly different from each other according to the heating rates R, and the temperature at which the curing viscosity VS is reached (the curing temperature Th) increases as the heating rate R increases. The temperature-viscosity characteristics are greatly changed by the heating rate R because the heating in this case is rapid heating and the NCF 112 is in a transient reaction in which response due to heating at a current time proceeds frequently while residual response due to heating a very short time before remains.

Figure 5:
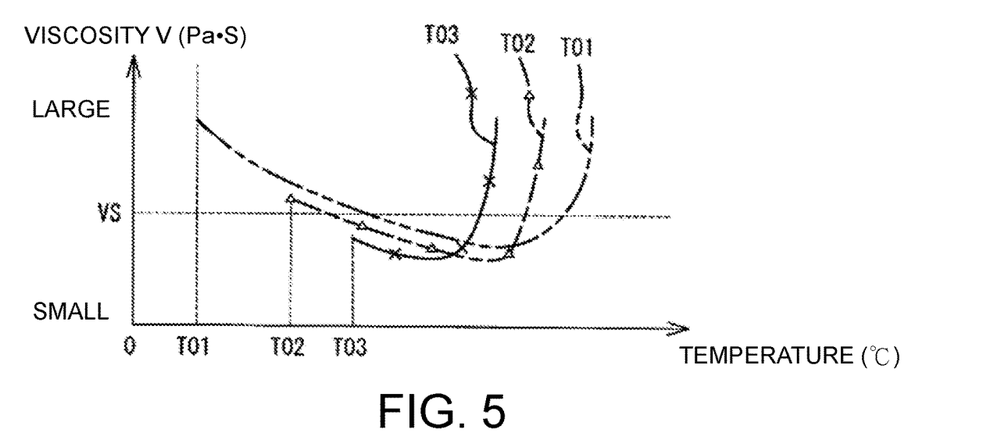
FIG. 5 is a diagram showing a difference in temperature-viscosity characteristics of an NCF due to a difference in a heating start temperature.

Further, the temperature-viscosity characteristic of the NCF 112 changes due to not only the heating rate R but also the temperature at which the heating of the NCF 112 starts, that is, the heating start temperature Ts. FIG. 5 is a diagram showing a difference in the temperature-viscosity characteristics due to a difference in the heating start temperature Ts. In FIG. 5, three curves are temperature-viscosity characteristic curves when the NCF 112 is heated at the same heating rate R according to three different heating start temperatures Ts=T01, T02, and T03 (T01<T02<T03). As is clear in FIG. 5, the temperature-viscosity characteristic curves of the NCF 112 are greatly different from each other according to the heating start temperature Ts, and as the heating start temperature Ts becomes lower, the temperature (the curing temperature Th) at which the curing viscosity VS is reached become higher.

Figure 6:
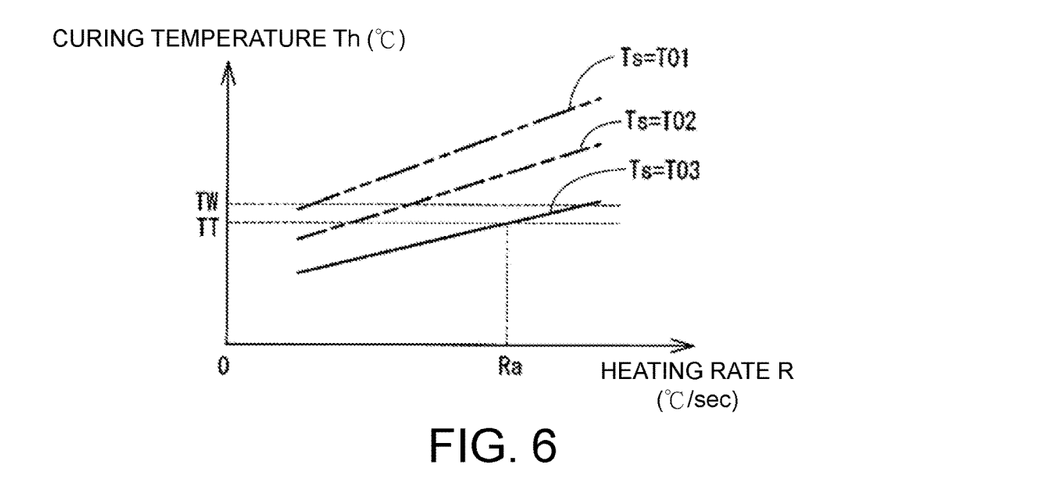
FIG. 6 is a diagram showing an example of curing property information.

Viscosity characteristic information is information which indicates a change in the curing temperature Th due to a difference in the heating conditions. FIG. 6 is a diagram showing an example of curing characteristic information. In FIG. 6, a horizontal axis indicates the heating rate R, and a vertical axis indicates the curing temperature. Further, three curves in FIG. 6 are heating rate-curing temperature characteristic curves for three different heating start temperatures Ts=T01, T02, and T03. Such viscosity characteristic information may be obtained by simulation or the like, or may be obtained by conducting an experiment in advance. Also, a storage format of the viscosity characteristic information in the library 36 may be a map format as shown in FIG. 6, a function format in which the heating rate-curing temperature characteristic curves shown in FIG. 6 are expressed as a mathematical formula, or a table format. In addition, although the difference in the heating start temperature Ts is also taken into account as the viscosity characteristic information in FIG. 6, the viscosity characteristic information needs not include information on the heating start temperature Ts as long as it can at least represent a correlation between the heating rate R and the curing temperature Th.

The initial evaluation condition determination unit 38 determines initial values of the bonding conditions (the evaluation conditions) used in the bonding evaluation with reference to the information stored in the library 36. That is, in the bonding evaluation, the desired bonding conditions are determined by actually repeating the bonding conditions while the evaluation conditions are changed. However, when the evaluation conditions are blindly changed, the number of trials becomes enormous, resulting in waste of cost and time. Therefore, in the example, the number of trials is significantly reduced by determining the initial values of the evaluation conditions on the basis of the information stored in the library 36.

Specifically, the initial evaluation condition determination unit 38 identifies the melting start temperature TW of the metal bumps 114 from quality of the material of the metal bumps 114 provided on the semiconductor chip 110 to be actually bonded. Subsequently, the initial evaluation condition determination unit 38 reads physical property information corresponding to the NCF 112 used for actual bonding from the library 36 and identifies a combination of the heating rate R and the heating start temperature Ts such that the curing temperature is lower than the melting start temperature TW.

For example, it is assumed that the target NCF 112 has curing temperature characteristics as shown in FIG. 6, and the melting start temperature of the metal bumps 114 of the target semiconductor chip 110 is TW in FIG. 6. In the bonding operation, the curing temperature Th of the NCF 112 is desirably slightly lower than the melting start temperature TW of the metal bumps 114. Therefore, in this case, the heating condition to be adopted in the bonding operation is a condition in which the curing temperature Th is equal to or lower than a target temperature TT slightly lower than the melting start temperature TW.

Further, in order to reduce a tact time of the bonding operation, it is desirable to minimize a time required to reach the melting start temperature TW. The time becomes shorter as the heating rate R is higher and the heating start temperature Ts is higher. However, in many cases, since the heating time is more greatly affected by the heating rate R than the heating start temperature Ts, the combination of the larger heating rate R is normally selected from the combinations of the heating rate R and the heating start temperature Ts which can be adopted. In the example of FIG. 6, the heating condition of the heating rate R=Ra and the heating start temperature Ts=T03 is selected as the initial value of the evaluation condition.

Next, the bonding evaluation performed on the basis of the evaluation conditions will be described in detail. As described above, in the bonding evaluation, the semiconductor chip 110 is actually bonded to the substrate 100 according to the set evaluation conditions, and the viscosity V of the NCF 112 at the time of the bonding is measured. Then, whether the current evaluation condition is good or not is determined on the basis of a value of the measured viscosity V. When it is determined that the evaluation conditions need to be corrected, the evaluation conditions are corrected, and the bonding and the measurement of the viscosity V are performed again.

More specifically, the bonding evaluation unit 40 drives the bonding unit 13 according to the set evaluation conditions and bonds the semiconductor chip 110 to the substrate 100. As described repeatedly, for appropriate bonding, the NCF 112 has to be cured before the metal bumps 114 are melted. Therefore, the bonding evaluation unit 40 measures the viscosity V of the NCF 112 when the metal bumps 114 are melted, and determines whether or not the measured viscosity V is equal to or higher than the curing viscosity VS. Here, a melting timing of the metal bumps 114 may be estimated from the temperature of the NCF 112 measured by the temperature sensor 32. Further, as another mode, the melting timing of the metal bumps 114 may be estimated from the thickness H of the NCF 112. This will be described with reference to FIG. 7.

Figure 7:
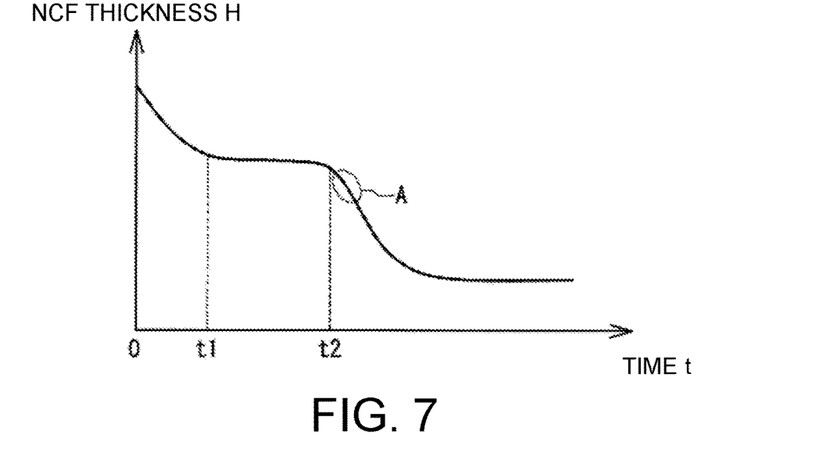
FIG. 7 is a diagram showing an example of a temporal change in a thickness of an NCF during a bonding operation.

FIG. 7 is a diagram showing an example of a temporal change in the thickness H of the NCF 112 at the time of the bonding operation. As shown in FIG. 7, since the NCF 112 is gradually softened in the initial stage (time 0 to t1) of the bonding, the thickness H sharply decreases. However, when the thickness H of the NCF 112 becomes equal to a height of the metal bump 114, the metal bumps 114 come into contact with a surface of the substrate 100, and thus further lowering of the semiconductor chip 110 and further reduction of the thickness H of the NCF 112 are hindered. As a result, the thickness H of the NCF 112 hardly changes during a period from the time t1 when the thickness H becomes substantially the same as the height of the metal bump 114 to the time t2 when the melting of the metal bumps 114 starts. However, when the melting of the metal bumps 114 starts at the time t2, the metal bumps 114 are crushed in a direction of the thickness H, and thus the thickness H of the NCF 112 temporarily decreases sharply. That is, the timing at which the thickness H of the NCF 112 falls below the height of the metal bump 114 can be identified as the melting timing of the metal bumps 114.

When the melting timing of the metal bumps 114 can be identified, the bonding evaluation unit 40 measures the viscosity V of the NCF 112 at the melting timing. As described above, in the example, the viscosity V of the NCF 112 is calculated from the temporal change of the thickness H using Equation 1. As is clear from the above description, during a period from the time t1 to the time t2, the thickness H of the NCF 112 hardly changes because the metal bumps 114 are in contact with the substrate 100. Therefore, it is not possible to accurately measure the viscosity V of the NCF 112 with the temporal change of the thickness H during the period. Therefore, it is desirable that the viscosity V of the NCF 112 at the melting timing be calculated from a change in the thickness H (a portion A in FIG. 7) immediately after the metal bumps 114 are melted.

When the viscosity V at the melting timing is obtained, the bonding evaluation unit 40 evaluates the viscosity V. That is, since the NCF 112 needs to be sufficiently cured at the time of melting of the metal bumps 114, the viscosity V is desirably equal to or higher than the curing viscosity VS. Further, when the viscosity V of the NCF 112 is excessively high at the time of melting, a higher heating rate R may be set.

Therefore, when the viscosity V at the melting timing can be measured, the bonding evaluation unit 40 compares the viscosity V with a minimum viscosity V min and a maximum viscosity V max which are preset reference values. The minimum viscosity V min is a minimum viscosity V that the NCF 112 should have at the time of melting of the metal bumps 114 and is, for example, a viscosity which is slightly higher than the curing viscosity VS. Further, the maximum viscosity V max is a maximum value of the viscosity V of the NCF 112 which is allowable at the time of melting. As a result of the comparison, when the measured viscosity V is less than the minimum viscosity V min, the heating conditions are corrected so that the curing temperature Th is reduced. Here, in order to decrease the curing temperature Th, the heating rate R may be reduced, or the heating start temperature Ts may be increased. However, in order to prevent an increase in the tact time, it is desirable to increase the heating start temperature Ts instead of decreasing the heating rate R. Further, as a result of the comparison, when the measured viscosity V exceeds the maximum viscosity V max, there is a possibility that the heating rate R may be further increased. Therefore, in this case, the heating rate R employed in the bonding evaluation is increased.

Figure 8:
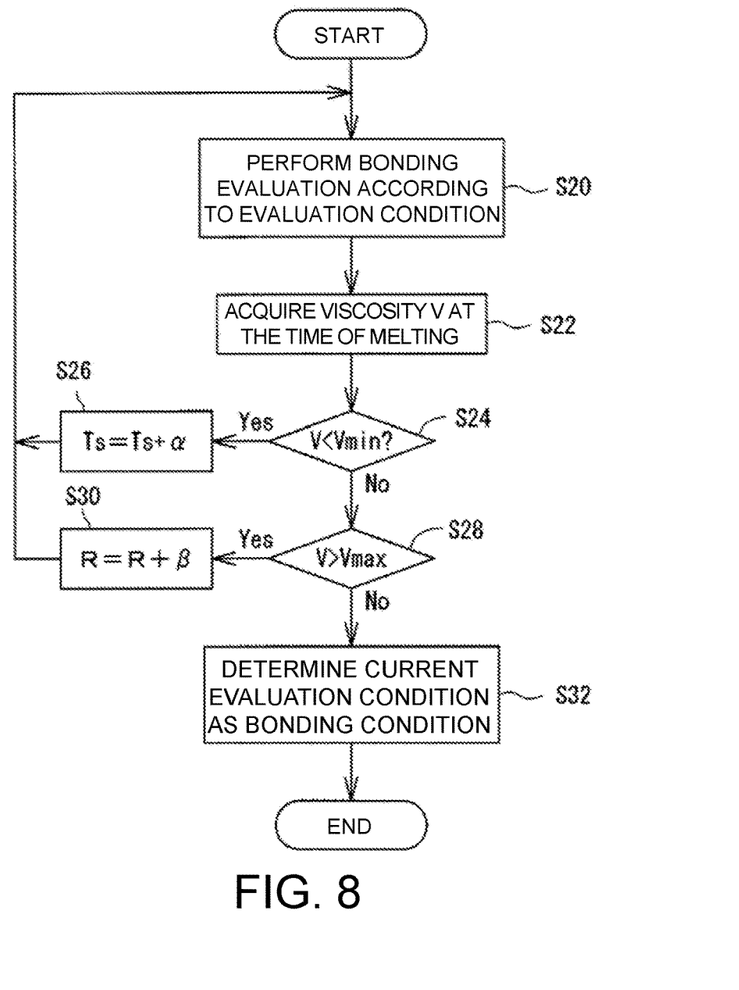
FIG. 8 is a flowchart showing a specific flow of a bonding condition identifying process.

The bonding evaluation unit 40 identifies the desired bonding conditions by repeating the execution of the bonding and the correction of the evaluation conditions as described above. FIG. 8 is a flowchart showing a detailed flow of the bonding condition identifying process (Steps S12 to S18 in FIG. 3). As shown in FIG. 8, first, the bonding evaluation unit 40 drives the bonding unit 13 according to the evaluation conditions and actually bonds the semiconductor chip 110 to the substrate 100 (S20). The evaluation condition at this time is a condition determined by the initial evaluation condition determination unit 38 in the first time and is a condition corrected in Steps S26 and S30, which will be described later, from the second time.

Furthermore, the bonding evaluation unit 40 acquires the viscosity V of the NCF 112 at the time when the metal bumps 114 are melted (S22). When the viscosity V can be obtained, subsequently, the viscosity V is compared with the minimum viscosity V min (S24). When the viscosity V is lower than the minimum viscosity V min, it can be determined that the curing temperature Th is lower than the melting start temperature TW, and in this case, the bonding evaluation unit 40 adds a predetermined correction value a to the heating start temperature Ts among the evaluation conditions (S26). The correction value a is a value set in advance according to the type of the NCF 112. When the evaluation conditions are corrected, the process returns to Step S20, and the bonding is performed again.

On the other hand, in the case of V≥V min, the bonding evaluation unit 40 compares the viscosity V with the maximum viscosity V max (S28). As a result of the comparison, when the viscosity V is higher than the maximum viscosity V max, the bonding evaluation unit 40 adds a predetermined correction value β to the heating rate R among the evaluation conditions (S30). The correction value β is also a value set in advance according to the type of the NCF 112. When the evaluation conditions are corrected, the process returns to Step S20, and the bonding is performed again.

In addition, when the viscosity V is equal to or more than the minimum viscosity V min and equal to or less than the maximum viscosity V max, it can be determined that the current evaluation conditions are desirable bonding conditions. Therefore, in this case, the current evaluation conditions are determined as the bonding conditions (S32). In this way, it is possible to derive the optimum bonding conditions by repeating the bonding evaluation while the evaluation conditions are corrected.

Here, as is clear from the above description, in the example, the initial values of the evaluation conditions are determined on the basis of the physical property information recorded in the library 36. In this way, the number of repetitions of the bonding evaluation can be significantly reduced by determining the initial values of the evaluation conditions in consideration of the physical property information of the NCF 112, and thus time and money costs for deriving the desired bonding conditions can be reduced.

Here, storing the physical property information of the NCF 112 in advance has been proposed in part in the past. However, conventionally, most of the stored physical property information was physical property information in a stable state in which the temperature change of the NCF 112 is poor. For example, the temperature-viscosity characteristics of the NCF 112 are provided by a material manufacturer or the like which manufactures and sells the NCF 112. However, the temperature-viscosity characteristics provided by the material manufacturer was temperature-viscosity characteristics when the heating was performed at a very low heating rate R (for example, 10° C./min≈0.167° C./sec) to minimize the influence of the transient reaction. On the other hand, when the bonding is actually performed, as described above, the NCF 112 and the semiconductor chip 110 are rapidly heated at a relatively high heating rate R (for example, 20° C./sec or more). In this case, since the viscosity of the NCF 112 changes complicatedly under the influence of the residual response at various timings, the temperature-viscosity characteristics during rapid heating are completely different from the temperature-viscosity characteristics in the stable state. Thus, even when the initial evaluation conditions were determined on the basis of the viscosity characteristics in the stable state provided by a material manufacturer or the like, it was difficult to significantly reduce the number of repetitions of the subsequent bonding evaluation.

On the other hand, in the example, the viscosity characteristics in the transient state when the NCF 112 is rapidly heated, in other words, the viscosity characteristics of the NCF 112 in a state close to the time of actual bonding are stored as the physical property information of the NCF 112. The number of repetitions of the bonding evaluation can be significantly reduced by determining the initial evaluation conditions with reference to the viscosity characteristics in the transient state, as compared with the case in which the viscosity characteristics in the stable state are referred.

The configuration described so far is an example. When the initial evaluation conditions are identified on the basis of the physical property information of the bonding member in the transient state, and the bonding evaluation according to the evaluation conditions is performed one or more times, other configurations may be changed as appropriate. For example, in the example, the bonding condition derivation support device 10 is incorporated in the mounting device 12, but the bonding condition derivation support device 10 may be an independent dedicated device. Further, in the example, the desired bonding conditions are determined by repeating the bonding evaluation. However, the bonding condition derivation support device 10 may perform the bonding evaluation according to the initial evaluation conditions only once. In this case, the operator may determine the bonding conditions on the basis of the viscosity V measured in one bonding evaluation. Furthermore, in the example, although the semiconductor chip is used as the first member, the substrate is used as the second member, and the NCF is used as the bonding member, the combination of the members may be changed as appropriate. For example, when the technology of the example is applied to a chip-on-chip in which a semiconductor chip is mounted on a semiconductor chip, the semiconductor chip serves as the first and second members. In addition, in the above-described example, although the NCF is exemplified as the bonding member, the bonding member is not limited to the NCF, as long as the physical properties change with the temperature, and a die attach film (DAF), an anisotropic conductive film (ACF), a silver paste, or the like may be used.

What is claimed is:

1. A bonding condition evaluation apparatus that assists in deriving bonding conditions when bonding is performed by applying heat and pressure to a first member and a second member with a bonding member interposed therebetween, the bonding condition evaluation apparatus comprising:
    a bonding unit that bonds the first member and the second member by applying heat and pressure with the bonding member interposed therebetween;
    a library in which a variety of physical property information including viscosity characteristic information indicating a correlation between a viscosity of the bonding member and a heating condition in a heated transient state is collected for each of a plurality of types of bonding members;
    an initial evaluation condition determination unit that acquires the physical property information corresponding to the bonding member used for bonding with reference to the library and determines an initial value of an evaluation condition of a bonding evaluation performed by bonding the first member and the second member; and
    a bonding evaluation unit that drives the bonding unit in accordance with set evaluation condition, bonds the first member and the second member and performs the bonding evaluation at least once to measure the viscosity of the bonding member at the time of the bonding.

2. The bonding condition evaluation apparatus according to claim 1, wherein the viscosity characteristic information is information that indicates a correlation between the viscosity and the heating condition when the bonding member is heated at a heating rate of 3° C./sec or more.

3. The bonding condition evaluation apparatus according to claim 1, wherein the viscosity characteristic information includes at least a change characteristic of the viscosity with respect to a temperature in accordance with a difference in a heating rate.

4. The bonding condition evaluation apparatus according to claim 3, wherein the viscosity characteristic information further includes a change characteristic of the viscosity with respect to a temperature in accordance with a difference in a heating start temperature.

5. The bonding condition evaluation apparatus according to claim 1, wherein the bonding evaluation unit determines whether the evaluation condition needs to be corrected on the basis of the viscosity measured in the bonding evaluation, repeats correction of the evaluation condition and re-execution of the bonding evaluation until it is determined that the correction is unnecessary, and identifies the corrected evaluation condition at the time when it is determined that the correction is unnecessary as the bonding condition.

6. The bonding condition evaluation apparatus according to claim 5, wherein:
   the first member is a semiconductor chip having metal bumps formed on a bottom surface, and
   the bonding evaluation unit determines whether or not it is necessary to correct the evaluation condition on the basis of the viscosity of the bonding member at a timing when the metal bumps are melted.

7. The bonding condition evaluation apparatus according to claim 6, wherein the bonding evaluation unit identifies a melting timing of the metal bumps on the basis of a change in a thickness of the bonding member and calculates the viscosity of the bonding member at the melting timing on the basis of the change in the thickness immediately after the melting timing.

\* \* \* \* \*